(12) United States Patent
Mallett

(10) Patent No.: US 11,782,110 B2
(45) Date of Patent: Oct. 10, 2023

(54) APPARATUS FOR MAGNETIC RESONANCE IMAGING

(71) Applicant: Siemens Healthcare Limited, Camberley (GB)

(72) Inventor: Michael John Disney Mallett, Faringdom (GB)

(73) Assignee: Siemens Healthcare Limited, Camberley (GB)

( * ) Notice: Subject to any disclaimer, the term of this patent is extended or adjusted under 35 U.S.C. 154(b) by 0 days.

(21) Appl. No.: 17/630,550

(22) PCT Filed: Jul. 7, 2020

(86) PCT No.: PCT/EP2020/069156
§ 371 (c)(1),
(2) Date: Jan. 27, 2022

(87) PCT Pub. No.: WO2021/018527
PCT Pub. Date: Feb. 4, 2021

(65) Prior Publication Data
US 2022/0252686 A1  Aug. 11, 2022

(30) Foreign Application Priority Data
Jul. 29, 2019 (GB) .................................. 1910782

(51) Int. Cl.
*G01R 33/385* (2006.01)
*G01R 33/38* (2006.01)
*H01F 6/04* (2006.01)
*G01R 33/3815* (2006.01)

(52) U.S. Cl.
CPC ..... *G01R 33/3854* (2013.01); *G01R 33/3804* (2013.01); *G01R 33/3856* (2013.01); *H01F 6/04* (2013.01); *G01R 33/3815* (2013.01)

(58) Field of Classification Search
CPC ............ G01R 33/3854; G01R 33/3804; G01R 33/3856; G01R 33/3815; H01F 6/04
See application file for complete search history.

(56) References Cited

U.S. PATENT DOCUMENTS

| | | | |
|---|---|---|---|
| 6,707,302 B2 | 3/2004 | Ries | |
| 7,535,225 B2 * | 5/2009 | Dietz | G01R 33/3815 324/309 |
| 2007/0257042 A1 | 11/2007 | Gore et al. | |
| 2012/0019249 A1 | 1/2012 | Kruip | |
| 2013/0157865 A1 | 6/2013 | Shen et al. | |
| 2016/0202332 A1 | 7/2016 | Huang et al. | |

FOREIGN PATENT DOCUMENTS

| | | | | |
|---|---|---|---|---|
| DE | 102016225347 A1 * | 6/2018 | ............. | G01R 33/42 |
| GB | 2437964 A | 11/2007 | | |
| GB | 2482632 A | 2/2012 | | |

* cited by examiner

Primary Examiner — Daniel R Miller
(74) Attorney, Agent, or Firm — Banner & Witcoff Ltd.

(57) ABSTRACT

A method for reducing a tendency of a thermal radiation shield for a superconducting magnet of a magnetic resonance imaging system to vibrate. A mass per unit area of the material of the thermal radiation shield is locally modified in a random or pseudo-random pattern.

4 Claims, 1 Drawing Sheet

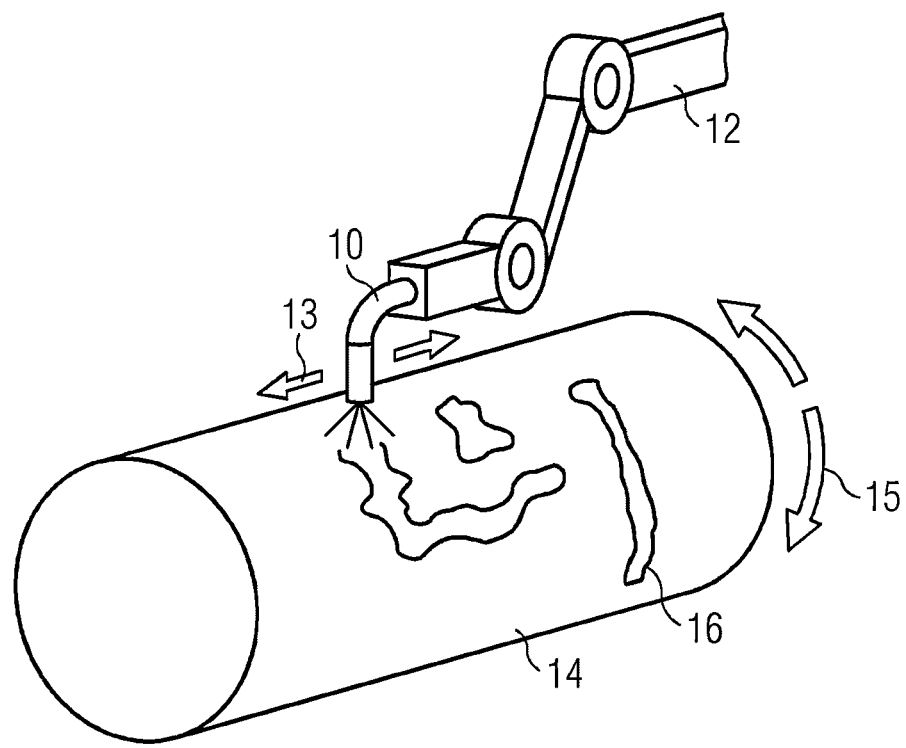

APPARATUS FOR MAGNETIC RESONANCE IMAGING

TECHNICAL FIELD

The present disclosure relates to improvements to an apparatus for magnetic resonance imaging. In particular, the disclosure relates to the shaping of a thermal radiation shield in a magnetic resonance imaging apparatus to reduce mechanical oscillations caused by interaction of such thermal radiation shield with an oscillating gradient magnetic field.

BACKGROUND

The present description makes particular reference to cylindrical superconducting magnets, but the methods and structure of the present disclosure may be applied to other shapes and types of magnet.

In a conventional magnetic resonance imaging system, a cylindrical superconducting magnet generates a high-strength static background magnetic field with high homogeneity in an imaging region, which imaging region is typically located approximately at the axial mid-point of the cylindrical superconducting magnet.

As part of the imaging process, oscillating gradient magnetic fields are generated by gradient coils provided for the purpose. The gradient magnetic fields so produced typically oscillate in three mutually orthogonal directions to provide appropriately-timed varying magnetic fields for imaging.

Conventional superconducting magnets operate at a cryogenic temperature, typically below 20 K. The parts of the system which are held at this temperature may be known as the "magnet cold mass". The magnet cold mass is enclosed within a vacuum vessel which is essentially at ambient temperature, for example 300 K. Cryogenic refrigerators may be used to maintain the superconducting magnet at its operating temperature but have a limited cooling power at that temperature. To reduce radiant thermal influx from the vacuum vessel to the magnet cold mass, it is typical to have a thermally conductive thermal radiation shield interposed between the vacuum vessel and the magnet cold mass. This is typically cooled to a temperature in the region of 50 K, and may be referred to as a "50 K shield" for brevity. At such temperatures, greater cooling power is available from conventional cryogenic refrigerators. Within the 50 K shield, much less thermal radiation is received from the thermal radiation shield at 50 K than would have been received from the vacuum vessel at 300 K.

Such thermal radiation shield is typically formed from sheets of an electrically conductive material such as aluminium. The oscillating gradient magnetic fields interact with the electrically conductive thermal radiation shield to generate oscillating electrical currents within the thermal radiation shield. These oscillating electrical currents in turn interact with the static background magnetic field and generate mechanical oscillations in the system. Such interactions may be known as "gradient coil interaction".

Gradient coil ("GC") interaction between the superconducting magnet and gradient coils is transferred to the magnet cold mass by mechanical vibration of the 50 K shield due to eddy currents generated in the 50 K shield from rapidly oscillating gradient fields. The mechanical vibration of the 50 K shield in turn produces oscillating magnetic fields which reach the cold mass, in turn inducing eddy currents in the magnet cold mass which cause localized heating.

Typically, in a cylindrical superconducting magnet system, the thermal radiation shield comprises an inner cylindrical wall, called the bore tube, an outer cylindrical wall, and two annular end pieces, the whole forming a hollow cylindrical enclosure.

Conventionally, the cylindrical symmetry of the shield bore tube and the axisymmetric geometry of the shield end pieces are ideally shaped to produce mechanical resonances when excited by an external driving force, for example the oscillating magnetic field of gradient coils.

The transfer of energy by mechanical vibrations caused by induced eddy currents has previously been dealt with by a number of techniques.

In one conventional arrangement, mechanical resonance conditions can be explicitly avoided by introducing 'forbidden' frequency bands into the gradient pulse sequence program, which controls current applied to the gradient coils—and so controls the variation in magnetic fields generated by the gradient coils. Software controlling the gradient pulse sequences is designed to avoid producing a resonant condition by avoiding pulse sequences which feature frequencies within the forbidden bands. This approach limits the flexibility of pulse sequence programming and any programmed sequence which observes these 'forbidden' frequency bands has reduced capability of accessing K-space as efficiently as it would if there were no 'forbidden' frequency bands.

Alternatively, or in addition, another conventional approach to reducing GC induced mechanical oscillation is to make the 50 K shield of thicker material. Increased thickness of the 50 K shield will stiffen it, which will reduce the amplitude of mechanical vibrations at the frequencies under consideration and therefore the energy transfer to the magnet cold mass will be reduced. The disadvantage to this approach is the increased cost due to increased material consumption, the increased weight of the 50 K shield leading to the need for more robust shield suspension, in turn leading to increased heat influx through the suspension arrangements. It also does not entirely eliminate the resonant conditions. The problematic resonant frequencies may simply be moved higher in frequency due to increased stiffness and may create similar problems at a different resonant frequency.

Alternatively, or in addition, another conventional approach to reducing GC induced mechanical oscillation is to provide an eddy current shield at another part of the magnet structure, usually on a surface of the warm bore tube of a cylindrical magnet arrangement. Such eddy current shield will typically be of a high conductivity material, either thick enough itself to be self-supporting, such as a thick Aluminium bore tube, or may be supported by an existing structure, such as a copper layer bonded to a stainless steel bore tube. The optimal location of the conductive surface of the eddy current shield would be closer to the GC. Such arrangement would require redesign of the GC to avoid reducing the efficiency of the GC secondary shielding, which would in turn compromise the capabilities of the GC, inevitably lowering the linearity, slew rate and gradient field magnitude. Problems may also be encountered due to eddy currents in the eddy current shield being nearer to the imaging volume than with more conventional arrangements.

Alternatively, or in addition, another conventional approach to reducing GC induced mechanical oscillation is to provide slitting of the radiation shield, or making the shield of a laminated material, to limit the length of thermally conductive paths within the 50 K shield. Limited conductive path length will reduce or break up the generation of eddy currents within the 50 K shield. The disadvantage of these approaches is that the oscillating gradient magnetic fields will have greater opportunity to penetrate the 50 K shield and impinge directly on the magnet cold mass. If the magnet cold mass has significant conductive components then the heating of the magnet cold mass can still occur by direct generation of eddy currents from the stray oscillating gradient field penetrating through the slits, which heating can be of greater magnitude than if the 50 K shield was unmodified by slitting or lamination.

SUMMARY

The present disclosure reduces the tendency of the thermal shield to resonate by introducing random or pseudo-random changes to the thickness, stiffness or local shape of the radiation shield.

Excessive heating can lead to destabilization of the superconductor, causing a magnet quench. The present disclosure seeks to reduce the likelihood of such heating of the magnet cold mass by gradient coil interaction.

It is an object of the present disclosure to provide a thermal radiation shield for use in a magnetic resonance imaging system, which is less susceptible to such mechanical oscillations. It is another object of the present disclosure to provide a magnetic resonance imaging system equipped with such a thermal radiation shield. It is a further object of the present disclosure to provide methods for manufacture of such a thermal radiation shield, and a yet further object of the present disclosure to provide methods for the design of such a thermal radiation shield.

The most significant gradient coil interaction with the magnet cold mass occurs within gradient field oscillation frequency bands related to mechanical resonance conditions of the system comprising the gradient coils, the 50 K shield and the magnet cold mass. Eliminating, or reducing, these resonance conditions would greatly reduce the amount of energy transferred to the cold mass, leading to lower levels of heating of the magnet cold mass. The present disclosure therefore seeks to reduce these resonant conditions by breaking up the geometric symmetry of the 50 K shield.

BRIEF DESCRIPTION OF THE DRAWING

The above, and further, objects, advantages and characteristics of the present disclosure will become more apparent from the following discussion of certain aspects of the disclosure, given by way of examples only, with reference to the accompanying drawings, wherein:

FIG. 1 illustrates a method according to the present disclosure.

DETAILED DESCRIPTION

According to an aspect of the disclosure, the mechanical resonance behaviour of the 50 K radiation shield in a superconducting MR magnet is adapted by providing regions of greater mass-per-unit area than other regions. Conventional 50 K shields are constructed of a sheet material of uniform density and uniform thickness, which accordingly has a uniform mass per unit surface area. Such conventional 50 K shields suffer from GC induced resonance as discussed above.

An aspect of the disclosure provides a thermal radiation shield which does not have a uniform mass per unit surface area. This may be achieved by adding material to certain locations on the thermal radiation shield, or by removing material from certain locations on the thermal radiation shield, or by a combination of these methods.

Preferred aspects of the present disclosure provide a thermal radiation shield in which regions of increased mass per unit area, and/or regions of reduced mass per unit area are located randomly or pseudo-randomly over the surface of the thermal radiation shield. In other aspects, instead of having regions with increased or reduced mass per unit area, regions may be provided which have variations in stiffness, or variations in local shape by dimpling, indenting or similar processes. Some aspects may employ variations in two or more of these characteristics. Such variations will also affect the resonant characteristics of the shield.

The random or pseudo-random location of the mass per unit area, the thickness, stiffness, and/or local shape changing features will break up the symmetry of the radiation shield and will reduce the tendency for the development of mechanical oscillation resonances. Oscillating GC magnetic fields will still reach the thermal radiation shield. Eddy currents will accordingly still be generated in the material of the thermal radiation shield. However, since the thermal radiation shield of the present disclosure will have a random or pseudo-random pattern of regions of differing mass per unit area, or thickness, or stiffness or local shape, or some combination of these features. This random or pseudo-random distribution will reduce the tendency of the thermal radiation shield to enter into mechanical resonance.

If regions of increased or reduced mass per unit area are located symmetrically about the surface of the thermal radiation shield, the associated symmetry will define new resonant frequencies, which may fall within a range of frequencies encountered during imaging. In certain aspects of the disclosure, specific mass or stiffness distribution may be provided in symmetric positions, thereby to 'tune' the bore tube so that it preferentially resonates at a particular frequency. This frequency is chosen to either be such that it poorly couples to the cryogen vessel, if present, or is outside normal resonant excitation range.

The reduction in the tendency of the thermal radiation shield to mechanically resonate will reduce the transfer of energy to the magnet cold mass and so reduce the heating of the magnet cold mass.

The random or pseudo-random nature of the material addition, removal, stiffness modification or shape change ensures that there is reduced opportunity for significant mechanical resonances of the thermal radiation shield to occur. The elimination or reduction of mechanical resonance due to GC interaction will reduce the energy transfer to the magnet cold mass.

Modification of the thermal radiation shield as proposed by the present disclosure preferably reduces the size of, or eliminates, forbidden bands of frequencies of gradient magnetic field oscillation. This may be found to improve the capabilities of the gradient pulse sequence programmer of the MRI imaging system by reducing its constraints.

Furthermore, in eliminating or reducing the heating of magnet cold mass due to GC interaction, higher power GC systems may be used in magnets with a low heating limit, for example magnets with low levels or no liquid cryogen in them, as the cooling system will only have to cope with a reduced level of GC induced heating in the magnet cold mass.

In one aspect of a method according to the present disclosure, the thermal radiation shield has extra material added to it by applying a weld pool, from for example a computer controlled MIG welder, in a random or pseudo-random pattern. Where it is applied, the extra material increases the mass per unit area of the thermal radiation shield. The random or pseudo-random distribution of the extra material removes the axial and circumferential mechanical symmetry of the thermal radiation shield thus reducing the tendency of the thermal radiation shield to mechanically oscillate at frequencies of applied gradient field within a range of frequencies of interest.

In another aspect of a method according to the present disclosure, material is removed from a surface of the thermal radiation shield by a suitable, computer controlled cutting tool, creating a random or pseudo-random pattern of cuts in the material, having zero mass per unit area, to reduce the build-up of symmetric eddy current patterns. In a variant of this method, the computer controlled cutting tool is replaced by a computer controlled milling tool or similar, which partially removes material from the thermal radiation shield, through part of its thickness only, creating a pseudo-random pattern of thinned regions in the material, having reduced mass per unit area. The cut or milled regions, each being of lower mass per unit area than uncut and unmilled regions, interrupt the symmetry of the material of the thermal radiation shield, and reduce its tendency to mechanically resonate.

The addition of material by a welding process will locally increase the mass per unit area of the thermal radiation shield due to the added weld pool and will locally reduce the stiffness of the material of the thermal radiation shield due to the annealing effect of the weld process. This change in mass per unit area and local stiffness will locally change the resonant behaviour of the material of the thermal radiation shield and so reduce the susceptibility of the thermal radiation shield to go into large scale mechanical vibration when externally excited by magnetic fields generated by gradient magnet field coils.

In a particular aspect of a method according to the present disclosure, illustrated in FIG. 1, a MIG welder 10 is attached to a robot 12 under computer control. The robot 12 provides axial movement 13 of the MIG welder along the length of bore tube 14 of a thermal radiation shield. The bore tube 14 is under rotational control 15 from the same computer. This provides full access to all parts of radially inner and outer surfaces of the bore tube 14.

The MIG welder 10 is controlled by the computer. Weld material 16 is added at pseudo-random locations on radially inner and/or radially outer surfaces of the bore tube. Such pseudo-random locations may be pre-programmed into the computer, or may be generated in a non-predetermined manner by a randomising algorithm within the computer. Pseudo-random distributions in differing mass per unit area and stiffness is thereby achieved.

A similar process can be used to add material at pseudo-random locations on inner and/or outer the surfaces of end pieces of the thermal radiation shield.

A computer algorithm can be used to generate the required pseudo-random distribution of material addition/removal. The algorithm may have a checking routine to prevent large scale repetitive patterns that might occur by chance, and to ensure that a similar amount of material modification occurs on both ends of the shield. This helps to ensure that during a magnet quench that there are no net forces trying to move the shield in any particular direction.

The material addition can be done by other methods, e.g. brazing, gluing or by a 3D-printing technique where discrete amounts of material are bonded to the surface of the radiation shield.

The material removal can be achieved by multiple methods e.g. CNC machining, drill holes, larger scale hole cutter, laser ablation, grinding methods etc. Where material is completely removed—e.g. by drilling or cutting holes, the local mass per unit are will become zero.

The local shape change method can be achieved by multiple methods, for example randomized indenting by a mechanical punch, rolling the shield material over a randomized pattern of protrusions, or similar approaches. At each such location, the local stiffness of the material will be changed. For example, in a location where a dimple is formed, the dimple will be stiffer than the immediately surrounding material. By providing a random or pseudo-random pattern of dimples, the tendency of the thermal radiation shield to resonate will be reduced.

The size and shape of material addition, material removal or shape change is varied to preferably match the frequency ranges of interest where maximum energy transfer reduction is advantageous. The eddy current pattern is generated by the interaction of the gradient magnetic field on the thermal radiation shield, and may be modelled by conventional computer models well known to those skilled in the art. Preferably, the present disclosure introduces asymmetries into the thermal radiation shield of similar length to the variations in the gradient magnetic field at the thermal radiation shield.

The asymmetric features of the present disclosure, introduced into the thermal radiation shield, preferably have a resolution which is a function of a gradient conductor pitch. In preferred aspects, the randomly or pseudo-randomly positioned features of the present disclosure introduced into the thermal radiation shield have a resolution of 1-10 cm.

The scale of geometry change will determine which resonant modes frequency bands are most significantly affected. The design process for a thermal radiation shield according to an aspect of the present disclosure may proceed thus: determine the magnetic field at the radiation shield generated by a static magnet field coils; determine the gradient magnetic field at the radiation shield; assess the typical length scale of the magnetic field distribution; and apply radiation shield material thickness, thinness, or stiffening over a randomised range of values close to the previously determined length scale of the gradient magnetic field interaction with the thermal radiation shield.

The invention claimed is:

1. A method for reducing a tendency of a thermal radiation shield for a superconducting magnet of a magnetic resonance imaging system to vibrate, the method comprising locally modifying a mass per unit area of a material of the thermal radiation shield, by local addition of mass to a thermal radiation shield of substantially uniform mass per unit area, by addition of extra material by applying a weld pool in a random or pseudo-random pattern.

2. A method for reducing a tendency of a thermal radiation shield for a superconducting magnet of a magnetic resonance imaging system to vibrate, the method comprising locally modifying a mass per unit area of a material of the thermal radiation shield, wherein the modifying the mass per unit area is performed by local removal of mass from a thermal radiation shield of substantially uniform mass per unit area by local partial removal of material thickness from a thermal radiation shield of substantially uniform mass per unit area in a random or pseudo-random pattern.

3. A thermal radiation shield for a superconducting magnet of a magnetic resonance imaging system, wherein a mass per unit area of a material of the thermal radiation shield is locally modified by local addition of mass to a thermal radiation shield of substantially uniform mass per unit area by addition of extra material by applying a weld pool in a random or pseudo-random pattern.

4. A thermal radiation shield for a superconducting magnet of a magnetic resonance imaging system, wherein a mass per unit area of a material of the thermal radiation shield is locally modified by local removal of mass from a thermal radiation shield of substantially uniform mass per unit area, whereby the thermal radiation shield comprises regions of partial removal of material thickness from a thermal radiation shield of substantially uniform mass per unit area in a random or pseudo-random pattern.

* * * * *